US006184545B1

United States Patent
Werner et al.

(10) Patent No.: US 6,184,545 B1
(45) Date of Patent: Feb. 6, 2001

(54) SEMICONDUCTOR COMPONENT WITH METAL-SEMICONDUCTOR JUNCTION WITH LOW REVERSE CURRENT

(75) Inventors: Wolfgang Werner, Munich; Jenoe Tihanyi, Kirchheim, both of (DE)

(73) Assignee: Infineon Technologies AG, Munich (DE)

( * ) Notice: Under 35 U.S.C. 154(b), the term of this patent shall be extended for 0 days.

(21) Appl. No.: 09/152,827

(22) Filed: Sep. 14, 1998

(30) Foreign Application Priority Data

Sep. 12, 1997 (DE) .............................. 197 40 195

(51) Int. Cl.[7] .................. H01L 29/74; H01L 29/085; H01L 29/095
(52) U.S. Cl. .................. 257/109; 257/471; 257/475; 257/484
(58) Field of Search ................... 257/484, 483, 257/342, 109, 481, 475, 471; 326/131

(56) References Cited

U.S. PATENT DOCUMENTS

| H40 | * | 4/1986 | Buchanan et al. | 257/484 |
|---|---|---|---|---|
| 4,110,775 | * | 8/1978 | Festa | 257/484 |
| 4,134,123 | * | 1/1979 | Shannon | 257/484 |
| 4,862,229 | * | 8/1989 | Mundy et al. | 257/484 |
| 5,017,976 | * | 5/1991 | Sugita | 257/494 |
| 5,081,509 | * | 1/1992 | Kozaka et al. | 257/106 |
| 5,101,244 | * | 3/1992 | Mori et al. | 257/260 |
| 5,371,400 | * | 12/1994 | Sakurai | 257/478 |
| 5,438,215 | * | 8/1995 | Tihanyi | 257/401 |
| 5,917,228 | * | 6/1999 | Matsuda et al. | 257/453 |

FOREIGN PATENT DOCUMENTS 43 09 764 A1   9/1994  (DE) .

OTHER PUBLICATIONS

"Physics of Semiconductor Devices" (Sze), Wiley Interscience Publication, 2nd edition, New Jersey, pp. 250–254.
"The Merged P–I–N Schottky (MPS) Rectifier: A High Voltage, High Speed Power Diode" (Baliga et al.), IEDM 1987, pp. 658–661.

* cited by examiner

Primary Examiner—Minh Loan Tran
Assistant Examiner—Shouxiang Hu
(74) Attorney, Agent, or Firm—Herbert L. Lerner; Laurence A. Greenberg; Werner H. Stemer

(57) ABSTRACT

The semiconductor component, such as a Schottky diode with a low leakage current, has a metal-semiconductor junction between a first metal electrode and the semiconductor. The semiconductor, which is of a first conductivity type, has a defined drift path and a plurality of supplementary zones of a second conductivity type extending from the semiconductor surface into the drift path. A number of foreign atoms in the supplementary zones is substantially equal to a number of foreign atoms in intermediate zones surrounding the supplementary zones and the number of foreign atoms does not exceed a number corresponding to a breakdown charge of the semiconductor.

8 Claims, 1 Drawing Sheet

SEMICONDUCTOR COMPONENT WITH METAL-SEMICONDUCTOR JUNCTION WITH LOW REVERSE CURRENT

BACKGROUND OF THE INVENTION

Field of the Invention

The invention relates to a semiconductor component having a metal semiconductor junction, and in particular to a Schottky diode with a low leakage current. The semiconductor component has a metal semiconductor junction between a metal that acts as a first electrode and a semiconductor of a first conductivity type with a drift path.

In IGBT power modules, pn diodes are currently used as freerunning diodes. These diodes have low impedance and a low reverse current. The switching losses, caused by the high concentration of minority carriers in the drift path, are a disadvantage. With regard to the switching losses, Schottky diodes would be ideal, because only majority carriers participate in the current transport. In addition, the lesser forward voltage of only 0.3 to 0.4 V in Schottky diodes, compared with about 0.7 V in pn diodes, is also advantageous for the static losses. A disadvantage of Schottky diodes, however, is the extremely high on-state resistance, because the Schottky diode is a majority carrier component. The reverse current of a Schottky diode is also very high. The reverse current is caused by the so-called Schottky barrier lowering: The high field intensity applied to the metal semiconductor junction in the off-state lowers the Schottky barrier, the consequence of which is a corresponding rise in the reverse current. This is described, for instance, by S. M. Sze in *Physics of Semiconductor Devices,* New York, p. 252.

This typical situation for unipolar components, which is that the on-state voltage, adjusted via the doping, determines the off-state capability of a component also exists in MOSFETs. Commonly owned U.S. Pat. No. 5,438,215 (German 43 09 764) proposed that higher-doped zones of the opposite conductivity type from the drift zone be disposed in the region of the space charge zone, in order to reduce the on-state resistance of a MOSFET. Between these higher-doped zones are zones that have the conductivity type of the inner zone but higher doping.

SUMMARY OF THE INVENTION

It is accordingly an object of the invention to provide a Schottky diode with a metal semiconductor junction, which overcomes the above-mentioned disadvantages of the heretoforeknown devices and methods of this general type and in which both the reverse current and the on-state resistance are markedly lower than in Schottky diodes of the prior art.

With the foregoing and other objects in view there is provided, in accordance with the invention, a semiconductor component, comprising:

a semiconductor of a first conductivity type with a surface and a drift path;

a first metal electrode disposed on the surface of the semiconductor and forming a metal-semiconductor junction with the semiconductor;

a plurality of supplementary zones of a second conductivity type disposed to extend from the surface into the drift path of the semiconductor; and a plurality of intermediate zone surrounding the supplementary zones;

wherein a number of foreign atoms in the supplementary zones is substantially equal to a number of foreign atoms in the intermediate zones and does not exceed a number corresponding to a breakdown charge of the semiconductor. (For a silicon semiconductor, the breakdown charge is in the range below $2 \cdot 10^{12}$ cm$^{-3}$.)

The semiconductor component according to the invention combines the advantages of the pn diode and the Schottky diode.

In accordance with an added feature of the invention, the supplementary zones extend through the entire drift path in the semiconductor.

In accordance with an additional feature of the invention, the intermediate zones between the supplementary zones have a lateral extent substantially similar to a lateral extent of the supplementary zones.

In accordance with another feature of the invention, a lateral extent of the supplementary zones and of the intermediate zones is substantially from 1 to 10 μm.

In accordance with a further feature of the invention, the semiconductor has a first semiconductor layer bounded by the surface and wherein a concentration of foreign atoms in the intermediate zones is greater than in the first semiconductor layer. The laterally adjoining semiconductor substrate then forms the peripheral region of the semiconductor component.

In accordance with again an added feature of the invention, the supplementary zones are disk-shaped zones or rod-shaped embedded in the intermediate zones.

In accordance with again an additional feature of the invention, each of the supplementary zones includes a junction zone (boundary zone) forming a guard ring adjacent the metal electrode and adjoining the surface of the semiconductor, the junction zone of each supplementary zone having a higher doping than a remainder of the supplementary zone. These junction zones increase the breakdown voltage of the component still further.

In accordance with a concomitant feature of the invention, the doping of the junction zones is selected so that, upon a polarization of the semiconductor component in a blocking direction thereof, charge carriers remain in the junction zones, i.e., not all the moveable charge carriers are removed from the junction zone.

Because of the pnpn column structure, in a semiconductor component according to the invention with a metal semiconductor junction, the drift path can be adjusted to have as low impedance as in a pn diode. The reverse current, because of the junction zone, such as p$^+$ regions that are locally congruent with the supplementary zones, such as "p-columns", can be adjusted to be about as low as in a pn diode. If the periphery of the metal semiconductor contact is disposed at a junction zone, for instance a p$^+$ region, then the p$^+$ region acts like a guard ring; that is, the portion of the reverse current that occurs because of excessive field intensity at the periphery of a normal Schottky diode is suppressed in the proposed structure.

Other features which are considered as characteristic for the invention are set forth in the appended claims.

Although the invention is illustrated and described herein as embodied in semiconductor component with metal semiconductor junction with low reverse current, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
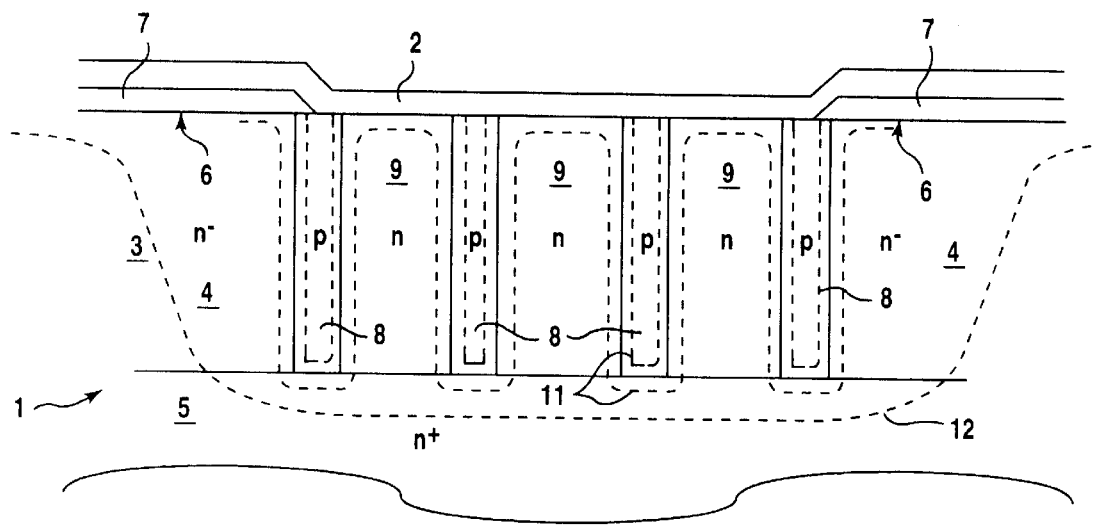
FIG. 1 is a partial, diagrammatic, cross sectional view of a structural example of a Schottky diode according to the invention.

Referring now to the figures of the drawing in detail and first, particularly, to FIG. 1 thereof, there is seen a semiconductor component 1 essentially including a metal contact 2 on a semiconductor 3. The metal 2 touches the semiconductor 3 in a window which is defined by an insulator layer 7. The metal is preferably PtSi or TaSi, but other materials can also be used for contacting the component 1. The insulator layer 7 covers the semiconductor 3 over a large portion of the surface 6 of the semiconductor. The insulator layer is interrupted only where it is desired that a contact with the semiconductor be made. In the manufacture of the semiconductor component, a metal layer can thus be applied in one production step, for contacting the component, over the entire surface of the semiconductor with the partially opened insulator layer 7. The insulator layer 7 prevents the contact of the metal 2 in the regions that it covers and allows the contact in the windows. If semiconductor material is Si, then the insulator layer 7 is preferably a $SiO_2$ layer.

Figure 2:
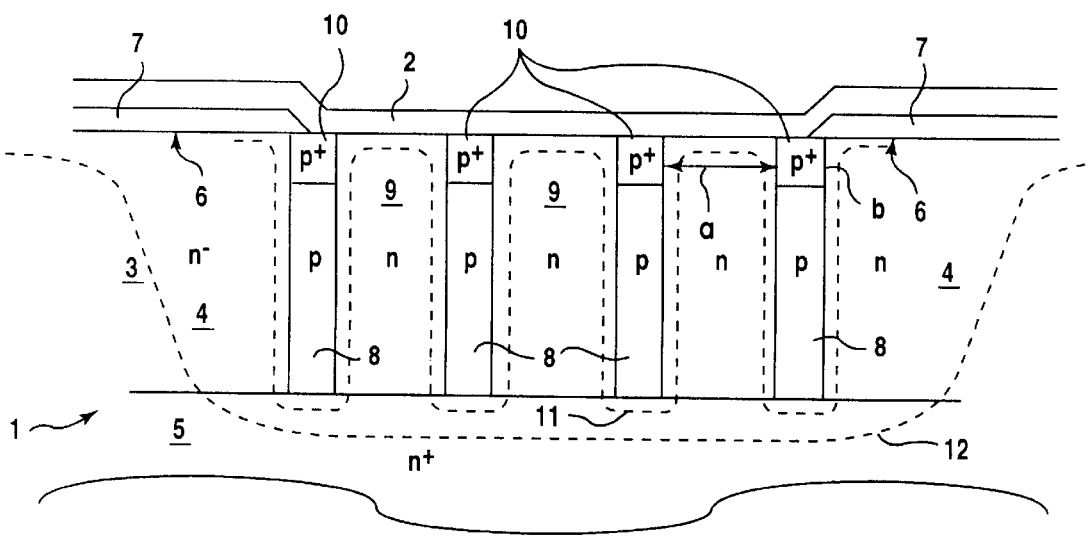
FIG. 2 is a partial, diagrammatic view of a further structural example of a Schottky diode with so-called guard rings.

In both FIGS. 1 and 2, a Schottky diode is shown which along with the metal contact 2 has two differently doped layers 4 and 5. The metal contact 2 is the first electrode of the Schottky diode. The first layer 4 is weakly doped and in the embodiment shown has the conductivity type $n^-$. It corresponds to the drift path for the charge carriers. The second semiconductor layer 5 adjoins the first semiconductor layer 4 and is connected on the opposite side to a non-illustrated second electrode. That second electrode, in particular, is an ohmic back-side contact. The second semiconductor layer 5 of the embodiment of the Schottky diodes shown is doped markedly higher than the first semiconductor layer 4 and is therefore designated $n^+$.

According to the invention, supplementary zones 8 are formed in the first semiconductor layer 4 which have the conductivity type opposite the conductivity type of the first semiconductor layer. In other words, here the zones 8 are of the p-conductivity type. The supplementary zones 8 may have different shapes. They may be formed in layers, or in other words extend uniformly over a relatively large extent perpendicular to the plane of the drawing, or they may be integrated in rod or column form into the first semiconductor layer 4. The cross section of the "rods" or the supplementary zones 8, in a plan view onto the semiconductor component 1, or in other words as viewed from the metallizing 2 toward the counterelectrode, may be square, rectangular, hexagonal, circular, or the like. The shape of the cross section depends, among other factors, on the form of the contact hole.

The supplementary zones 8 preferably have a depthwise extent into the semiconductor 3, that is, into the drift zone, of approximately 50 μm. The lateral extent of the supplementary zones 8 is on the order of magnitude of approximately 1 to 5 μm. If the intermediate zone 9 has the same doping as the supplementary zone 8, then its lateral extent must be precisely the same as that of the supplementary zone, or in other words must likewise be about 1 μm. If the dopings of the supplementary zones 8 and of the intermediate zones 9 are different, then because of the condition of equal area charge (in cross section) of the two zones, a correspondingly different lateral extent of the supplementary zones 8 and the intermediate zones 9 results.

Intermediate zones 9 result between the supplementary zones 8. The shape of the intermediate zones 9 is determined by the shape of the supplementary zones 8. The conductivity type of the intermediate zones is again the same as that of the first semiconductor layer 4; that is, in the embodiment shown in FIG. 1, the intermediate zones 9 in the first semiconductor layer 4 and in the intermediate zones 9 are of the n-conductivity type. The doping in the intermediate zone 9 is preferably selected to be higher than in the peripheral region of the first semiconductor layer 4, so that the intermediate zones 9 are n-doped, instead of $n^-$-doped, as in the case of the first semiconductor layer 4.

In the forward direction, that is, when the potential at the metal electrode 2 is more positive than at the second electrode or counter electrode, a high conducting-state current flows. The conducting-state current flows directly via the metal semiconductor junction between the intermediate zones 9 and the metal electrode 2.

To explain the mode of operation of the component according to the invention in the depletion direction (the metal 2 is at a more-negative potential than the counter electrode), two first lines 11 are shown in dashed lines in FIG. 1. The lines 11 indicate the extent of the space charge zone in the supplementary zone 8 and the intermediate zone 9 for a low reverse voltage at the Schottky diode.

In the case of the reverse voltage represented by the line 11, the movable charge carriers are partly cleared out of the pnpn structure, resulting in the space charge zone shown. As can be seen from FIG. 1, however, the clearing of the supplementary zones 8 and intermediate zones 9 is not complete.

If the reverse voltage is increased further, then further charge carriers are cleared away: The space charge zone expands. Because of the slight extent of the supplementary zone 8 and the intermediate zone 9 (their lateral extent is on the order of magnitude of 1:10 μm), the charge carriers are already completely cleared out of the supplementary zones 8 and the intermediate zones at relatively low reverse voltages. This case is represented by a second dashed line 12. The boundary of the space charge zone on the side toward the counter electrode has shifted somewhat farther into the semiconductor 3, while on the other side it virtually coincides with the metal semiconductor junction and is therefore not shown in FIG. 1. Since the movable charge carriers are cleared out at the relatively low reverse voltage corresponding to the line 12, the Schottky diode 1 already blocks at this low voltage and at a correspondingly low reverse current. The reverse voltage itself depends practically only on the extent of the layer 4.

In a second embodiment of the semiconductor component 1 of the invention, a junction zone 10 is created in the semiconductor substrate 3 on the end toward the metal of the supplementary zone 9. This second embodiment is shown in FIG. 2.

The junction zones 10 are of a different conductivity type from the semiconductor material 4 surrounding them. In other words, they have the same conductivity type as the supplementary zone 8. While the supplementary zones 8 are p-doped, however, the junction zone 10 has a higher doping, that is, in the exemplary embodiment shown it is $p^+$-doped. By this provision, electrical field intensity at the metal semiconductor junction and thus the reverse current as well is dramatically reduced. The important parameter in the configuration according to FIG. 2 is the ratio between a depth b of the junction zone 10 to a spacing a of the individual junction zones 10 from one another. Thus the field intensity at the metal semiconductor contact can be set all the lower, the greater the selected ratio b:a.

By means of the $p^+$ regions, which are disposed locally congruently with the "p-columns," the reverse current can be set approximately as low as in a pn junction. Furthermore, the $p^+$ region acts like a guard ring, if the periphery of the metal semiconductor contact is disposed on a $p^+$ region. As a result, the high field intensity at the edges of the contact hole is lowered, and the portion of the reverse current that occurs as a result of excessive field intensity at the edge of a normal Schottky diode is suppressed.

We claim:

1. A semiconductor component, comprising:

a semiconductor of a first conductivity type with a surface and a drift path;

a first metal electrode disposed on the surface of said semiconductor and forming a metal-semiconductor junction with said semiconductor;

a plurality of supplementary zones of a second conductivity type disposed to extend from said surface into said drift path of said semiconductor, each of said supplementary zones includes a junction zone adjacent said first metal electrode and adjoining the surface of said semiconductor, said junction zone of each supplementary zone having a higher doping concentration than a remainder of said supplementary zone;

a plurality of intermediate zones surrounding said supplementary zones; and said supplementary zones having a doping concentration substantially equal to a doping concentration in said intermediate zones not exceeding a doping concentration which would result in a barrier breakdown in said semiconductor.

2. The semiconductor component according to claim 1, wherein said supplementary zones extend through the entire drift path in said semiconductor.

3. The semiconductor component according to claim 1, wherein said intermediate zones between said supplementary zones have a lateral extent substantially similar to a lateral extent of said supplementary zones.

4. The semiconductor component according to claim 1, wherein a lateral extent of said supplementary zones and of said intermediate zones is substantially from 1 to 10 $\mu$m.

5. The semiconductor component according to claim 1, wherein said semiconductor has a first semiconductor layer bounded by said surface and wherein said doping concentration in said intermediate zones is greater than in said first semiconductor layer.

6. The semiconductor component according to claim 1, wherein said supplementary zones are disk-shaped zones embedded in said intermediate zones.

7. The semiconductor component according to claim 1, wherein said supplementary zones are rod-shaped zones embedded in said intermediate zones.

8. The semiconductor component according to claim 1, wherein said junction zone forms a guard ring.

* * * * *